United States Patent
Aikawa et al.

(10) Patent No.: US 11,837,490 B2
(45) Date of Patent: Dec. 5, 2023

(54) ELECTROSTATIC CHUCK HEATER

(71) Applicant: NGK INSULATORS, LTD., Nagoya (JP)

(72) Inventors: Kenichiro Aikawa, Handa (JP); Yuji Akatsuka, Handa (JP); Hiroshi Takebayashi, Handa (JP); Takahiro Ando, Nagoya (JP)

(73) Assignee: NGL INSULATORS, LTD., Nagoya (JP)

( * ) Notice: Subject to any disclaimer, the term of this patent is extended or adjusted under 35 U.S.C. 154(b) by 420 days.

(21) Appl. No.: 17/224,183

(22) Filed: Apr. 7, 2021

(65) Prior Publication Data

US 2021/0225683 A1    Jul. 22, 2021

Related U.S. Application Data

(63) Continuation of application No. PCT/JP2020/034909, filed on Sep. 15, 2020.

(30) Foreign Application Priority Data

Sep. 18, 2019  (JP) .................................. 2019-169348

(51) Int. Cl.
  *H01L 21/683*  (2006.01)
  *H01L 21/67*  (2006.01)
  (Continued)

(52) U.S. Cl.
  CPC .... *H01L 21/6833* (2013.01); *H01L 21/67103* (2013.01); *H05B 3/03* (2013.01); *H05B 3/18* (2013.01)

(58) Field of Classification Search
  CPC ........... H01L 21/6833; H01L 21/67103; H01L 21/683
  See application file for complete search history.

(56) References Cited

U.S. PATENT DOCUMENTS

2003/0098299 A1*  5/2003  Hiramatsu ............. H05B 3/143
                                                                  219/465.1
2014/0287585 A1    9/2014  Ashizawa et al.
(Continued)

FOREIGN PATENT DOCUMENTS

JP    H09-190873 A1    7/1997
JP    2001-313271 A    11/2001
(Continued)

OTHER PUBLICATIONS

Korean Office Action (with English translation) dated Feb. 8, 2023 (Application No. 10-2021-7010473).
(Continued)

*Primary Examiner* — Jue Zhang
*Assistant Examiner* — Afework S Demisse
(74) *Attorney, Agent, or Firm* — BURR PATENT LAW, PLLC

(57) ABSTRACT

An electrostatic chuck heater according to the present invention includes an alumina substrate having a wafer placement surface on its upper surface; an electrostatic electrode, a resistance heating element provided for each zone, and a multilayer jumper wire for supplying power to the resistance heating element, which are buried in the alumina substrate in this order from the wafer placement surface side; a heating element coupling via for vertically coupling the resistance heating element to the jumper wire; and a power supply via extending outward for supplying power to the jumper wire. At least the heating element coupling via and the power supply via contain ruthenium metal.

8 Claims, 2 Drawing Sheets

(51) Int. Cl.
  *H05B 3/03* (2006.01)
  *H05B 3/18* (2006.01)

(56) References Cited

U.S. PATENT DOCUMENTS

| | | | |
|---|---|---|---|
| 2015/0380119 A1 | 12/2015 | Nagamine | |
| 2017/0117175 A1 | 4/2017 | Katsuda et al. | |
| 2017/0280509 A1 | 9/2017 | Takebayashi | |
| 2018/0047606 A1* | 2/2018 | Kin | H01L 21/67103 |
| 2019/0082937 A1 | 3/2019 | Hayashi et al. | |

FOREIGN PATENT DOCUMENTS

| | | |
|---|---|---|
| JP | 2002-026338 A | 1/2002 |
| JP | 2005-005057 A | 1/2005 |
| JP | 2006-222008 A | 8/2006 |
| JP | 2006-232694 A | 9/2006 |
| JP | 2010-025662 A | 2/2010 |
| JP | 2014-075525 A1 | 4/2014 |
| JP | 2014-185353 A | 10/2014 |
| JP | 2016-100243 A | 5/2016 |
| JP | 2017-214546 A | 12/2017 |
| JP | 2017-228360 A1 | 12/2017 |
| JP | 2018-037488 A | 3/2018 |
| JP | 2019-099401 A | 6/2019 |
| WO | 2014/103712 A1 | 7/2014 |
| WO | 2016/042957 A1 | 3/2016 |
| WO | 2017/029876 A1 | 2/2017 |

OTHER PUBLICATIONS

International Search Report and Written Opinion (Application No. PCT/JP2020/034909) dated Nov. 2, 2020.
English translation of International Preliminary Report on Patentability (Chapter I) (Application No. PCT/JP2020/034909) dated Mar. 31, 2022, 6 pages.
Japanese Office Action (with English translation) dated Jul. 11, 2023 (Application No. 2021-518827)

* cited by examiner

ELECTROSTATIC CHUCK HEATER

BACKGROUND OF THE INVENTION

1. Field of the Invention

The present invention relates to an electrostatic chuck heater.

2. Description of the Related Art

Electrostatic chuck heaters have been used to suck and hold a semiconductor wafer in the processing of the semiconductor wafer. As a known electrostatic chuck heater, Patent Literature 1 discloses an electrostatic chuck heater that includes an electrostatic chuck with an electrostatic electrode buried in a sintered ceramic and a resin sheet with a plurality of resistance heating elements, one surface of the resin sheet being resin-bonded to the electrostatic chuck. The sheet heater also includes a jumper wire for supplying power to each of the resistance heating elements, a heating element coupling via for vertically coupling the resistance heating elements to the jumper wire, and a power supply via extending outward for supplying power to the jumper wire.

CITATION LIST

Patent Literature

PTL 1: International Publication No. WO 2017/029876

SUMMARY OF THE INVENTION

In such electrostatic chuck heaters, resin sheets do not have sufficient heat resistance and heat transfer capability. Thus, there has been a demand for a structure with an electrode buried in a sintered ceramic. In particular, alumina ceramics have the problem of cracking between alumina and vias.

The present invention has been made to solve such problems and principally aims to reduce cracking in an electrostatic chuck heater that includes an electrostatic electrode, a resistance heating element, a jumper wire, and a via in an alumina substrate.

An electrostatic chuck heater according to the present invention includes an alumina substrate having a wafer placement surface on its upper surface; an electrostatic electrode, a resistance heating element provided for each zone, and a multilayer jumper wire for supplying power to the resistance heating element, which are buried in the alumina substrate in this order from the wafer placement surface side; a heating element coupling via for vertically coupling the resistance heating element to the jumper wire; and a power supply via extending outward for supplying power to the jumper wire,
wherein each of the heating element coupling via and the power supply via contains 10% to 95% by weight ruthenium metal and has a difference in thermal expansion coefficient within ±0.6 ppm/K from the alumina substrate.

In this electrostatic chuck heater, the heating element coupling via and the power supply via buried in the alumina substrate may be increased in size to lower the resistance and to decrease the amount of heat generation. In such a case, however, a large residual stress due to the thermal expansion difference between the alumina substrate and the vias is likely to cause cracking. Each via has a ruthenium metal content in the range of 10% to 95% by weight (preferably 20% to 95% by weight). Alumina has a thermal expansion coefficient of 7.9 ppm/K in the temperature range of 40° C. to 800° C., and ruthenium metal has a thermal expansion coefficient of 7.2 ppm/K in the temperature range of 40° C. to 800° C. The difference in thermal expansion coefficient between the vias and the alumina substrate is within ±0.6 ppm/K. The thermal expansion difference between the alumina substrate and the vias is therefore very small. This can reduce cracking during production and use.

The thermal expansion coefficient in the temperature range of 40° C. to 800° C. is calculated by dividing the expansion (unit: µm) per meter in the temperature range of 40° C. to 800° C. by the temperature difference of 760° C. (K) (the same applies hereinafter).

In an electrostatic chuck heater according to the present invention, the heating element coupling via and the power supply via may contain a filler component in addition to the ruthenium metal. The filler component is preferably alumina and/or zirconia. Alumina, which is the same material as the base material (the alumina substrate), improves the interfacial strength between the heating element coupling via and the base material. Zirconia has a higher thermal expansion coefficient than alumina. Thus, the addition of a small amount of zirconia can adjust the thermal expansion coefficient of the heating element coupling via to the thermal expansion coefficient of the alumina substrate. The addition of both alumina and zirconia as filler components produces both effects.

In an electrostatic chuck heater according to the present invention, the electrostatic electrode, the resistance heating element, and the jumper wire may also contain 10% to 95% by weight (preferably 20% to 95% by weight) ruthenium metal and may have a difference in thermal expansion coefficient within ±0.6 ppm/K from the alumina substrate. This significantly decreases the thermal expansion difference between alumina and each of the electrostatic electrode, the resistance heating element, the jumper wire, and the via. This can further reduce cracking during production and use. In such a case, the electrostatic electrode, the resistance heating element, and the jumper wire may contain a filler component in addition to the ruthenium metal. The filler component is preferably alumina and/or zirconia.

DETAILED DESCRIPTION OF THE INVENTION

Figure 1:
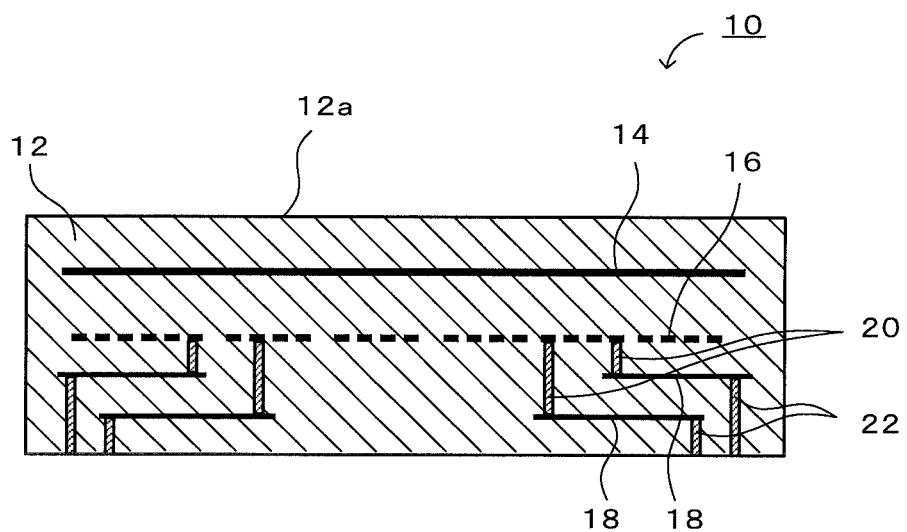
FIG. 1 is a longitudinal sectional view of an electrostatic chuck heater 10.

Preferred embodiments of the present invention are described below with reference to the accompanying drawings. FIG. 1 is a longitudinal sectional view of an electrostatic chuck heater.

As illustrated in FIG. 1, an electrostatic chuck heater 10 includes an alumina substrate 12 having a wafer placement surface 12a on its upper surface, and an electrostatic electrode 14 (an ESC electrode), a resistance heating element 16 provided for each zone, and a multilayer (illustrated here as two-layer) jumper wire 18 for supplying power to the resistance heating element 16, which are buried in the alumina substrate 12 in this order from the wafer placement surface 12a side. A heating element coupling via 20 for vertically coupling the resistance heating element 16 to the jumper wire 18 and a power supply via 22 extending outward for supplying power to the jumper wire 18 are formed in the alumina substrate 12.

The heating element coupling via 20 and the power supply via 22 contain ruthenium metal. The ruthenium metal content preferably ranges from 10% to 95% by weight. The ruthenium metal content more preferably ranges from 20% to 95% by weight, still more preferably 60% to 95% by weight, in view of reducing heat generation just above the vias 20 and 22. The difference in thermal expansion coefficient between the vias 20 and 22 and the alumina substrate 12 is within ±0.6 ppm/K. The heating element coupling via 20 and the power supply via 22 may contain a filler component in addition to the ruthenium metal. The filler component is preferably alumina and/or zirconia. As described above, alumina has a slightly higher thermal expansion coefficient than ruthenium metal. Thus, alumina is useful as a filler component in making the thermal expansion coefficients of the vias 20 and 22 closer to that of alumina. Alumina, which is an insulating material, is also useful as a filler component in increasing the resistivities of the vias 20 and 22. Zirconia has a thermal expansion coefficient of 10.5 ppm/K in the temperature range of 40° C. to 800° C. Thus, zirconia is useful as a filler component in increasing the thermal expansion coefficients of the vias 20 and 22. More specifically, the addition of only a small amount of zirconia to the vias 20 and 22 can increase the thermal expansion coefficients of the vias 20 and 22. Furthermore, zirconia has no or low reactivity to ruthenium metal even at high temperatures, has small effects on the resistivity of ruthenium metal, and is preferred as a filler component also in this respect.

The electrostatic electrode 14, the resistance heating element 16, and the jumper wire 18 also preferably contain ruthenium metal. The ruthenium metal content preferably ranges from 10% to 95% by weight, more preferably 20% to 95% by weight, still more preferably 60% to 95% by weight. The difference in thermal expansion coefficient between the alumina substrate 12 and each of the electrostatic electrode 14, the resistance heating element 16, and the jumper wire 18 is within ±0.6 ppm/K. The electrostatic electrode 14, the resistance heating element 16, and the jumper wire 18 may contain a filler component in addition to the ruthenium metal. The filler component is preferably alumina and/or zirconia. As described above, alumina has a slightly higher thermal expansion coefficient than ruthenium metal. Thus, alumina is useful as a filler component in making the thermal expansion coefficients of the electrostatic electrode 14, the resistance heating element 16, and the jumper wire 18 closer to that of alumina. Alumina, which is an insulating material, is also useful as a filler component in increasing the electrical resistance of the electrostatic electrode 14, the resistance heating element 16, and the jumper wire 18. For example, the amount of alumina to be added to the electrostatic electrode 14, the resistance heating element 16, and the jumper wire 18 can be changed to easily adjust the resistivity without substantially changing the thermal expansion coefficient. Zirconia has a thermal expansion coefficient of 10.5 ppm/K in the temperature range of 40° C. to 800° C. Thus, zirconia is useful as a filler component in increasing the thermal expansion coefficients of the electrostatic electrode 14, the resistance heating element 16, and the jumper wire 18. More specifically, the addition of only a small amount of zirconia to these members can increase the thermal expansion coefficients of these members. Furthermore, zirconia has no or low reactivity to ruthenium metal even at high temperatures, has small effects on the resistivity of ruthenium metal, and is preferred as a filler component also in this respect.

In the electrostatic chuck heater 10 described above in detail, the heating element coupling via 20 and the power supply via 22 buried in the alumina substrate 12 may be increased in size to lower the resistance and to decrease the amount of heat generation. In such a case, however, a large residual stress due to the thermal expansion difference between the alumina substrate 12 and the vias 20 and 22 is likely to cause cracking. The vias 20 and 22 contain ruthenium metal. Alumina has a thermal expansion coefficient of 7.9 ppm/K in the temperature range of 40° C. to 800° C., and ruthenium metal has a thermal expansion coefficient of 7.2 ppm/K in the temperature range of 40° C. to 800° C. The difference in thermal expansion coefficient between the vias 20 and 22 and the alumina substrate 12 is within ±0.6 ppm/K. Thus, the thermal expansion difference between the alumina substrate 12 and the vias 20 and 22 is very small. This can reduce cracking during production and use.

Furthermore, the electrostatic electrode 14, the resistance heating element 16, and the jumper wire 18 also contain ruthenium metal, and therefore the thermal expansion difference between alumina and each of the electrostatic electrode 14, the resistance heating element 16, the jumper wire 18, and the vias 20 and 22 is very small. This can further reduce cracking during production and use.

The present invention is not limited to the above-described embodiment, and can be carried out by various modes as long as they belong to the technical scope of the invention.

Figure 2:
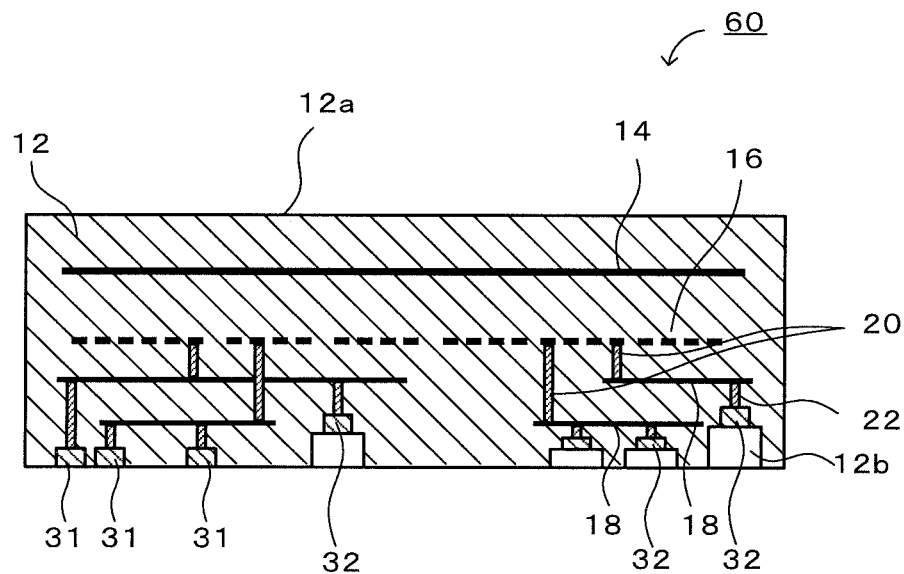
FIG. 2 is a cross-sectional view of another electrostatic chuck heater 60.
Figure 3:
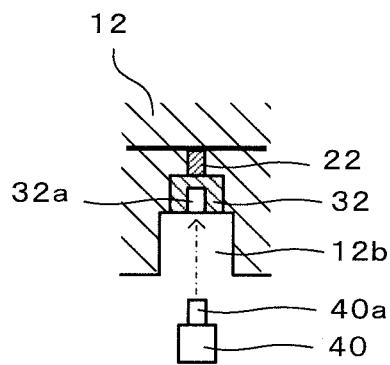
FIG. 3 is an explanatory view of the coupling between a second power supply terminal 32 and an external terminal 40.
Figure 4:
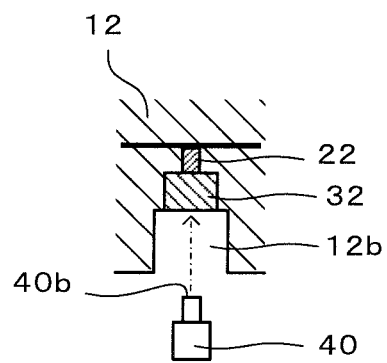
FIG. 4 is an explanatory view of the coupling between a second power supply terminal 32 and an external terminal 40.

For example, in the above embodiments, as in an electrostatic chuck heater 60 illustrated in FIG. 2, first and second power supply terminals 31 and 32 containing ruthenium metal may be buried in the alumina substrate 12. The components of the electrostatic chuck heater 10 are denoted by the same reference numerals and letters in FIG. 2. The first and second power supply terminals 31 and 32 are buried in the alumina substrate 12 while the electrostatic chuck heater 60 is produced. Each upper surface of the first and second power supply terminals 31 and 32 is in contact with the lower surface of the power supply via 22. The first power supply terminal 31 is provided such that the lower surface of the first power supply terminal 31 is flush with the lower surface of the alumina substrate 12. The second power supply terminal 32 is provided such that the lower surface of the second power supply terminal 32 is flush with the bottom of a bottomed cylindrical hole 12b formed on the lower surface of the alumina substrate 12. The power supply terminals 31 and 32 contain ruthenium metal and have a very small thermal expansion difference from the alumina substrate 12. This can reduce cracking originating from the power supply terminals during production and use. The ruthenium metal content of each of the first and second power supply terminals 31 and 32 preferably ranges from 10% to 95% by weight, more preferably 20% to 95% by weight, still more preferably 60% to 95% by weight. The difference in thermal expansion coefficient between the first and second power supply terminals 31 and 32 and the alumina substrate 12 is preferably within ±0.6 ppm/K. Coupling between the power supply terminals 31 and 32 and an external terminal is described below with respect to the second power supply terminal 32 with reference to FIGS. 3 and 4. In FIG. 3, a fitting hole 32a formed in the lower surface of the second power supply terminal 32 is fitted to a front end 40a of an external terminal 40 to couple the second power supply terminal 32 to the external terminal 40. In FIG. 4, an upper surface 40b of the external terminal 40 is pressed against the lower surface of the second power supply terminal 32 to couple the second power supply terminal 32 to the external terminal 40. The first power supply terminal 31 can be coupled to an external terminal in the same manner. This eliminates the need for brazing the power supply terminals 31 and 32 to the power supply via 22 and reduces the production costs. The first and second power supply terminals 31 and 32 may contain the filler component described above in addition to the ruthenium metal.

In the above embodiments, the main components of the heating element coupling via 20 and the power supply via 22 may be ruthenium metal. The main components of the electrostatic electrode 14, the resistance heating element 16, and the jumper wire 18 may be ruthenium metal. The term "main component" refers to a component with a volume percentage of 50% or more by volume or a component with the highest volume percentage among all components.

Examples

The electrostatic chuck heater 10 illustrated in FIG. 1 was produced in experimental examples 1 to 10. The electrostatic chuck heater 10 included the electrostatic electrode 14 290 mm in diameter and 0.1 mm in thickness, inner and outer resistance heating elements 16, a ribbon-like jumper wire 18 5 mm in width, and the vias 20 and 22 1.2 mm in diameter and 0.6 mm in thickness, buried in the alumina substrate 12 300 mm in diameter and 4 mm in thickness. The inner resistance heating element 16 was wired in a one-stroke pattern in a circular region 200 mm in diameter concentric with the alumina substrate 12. The outer resistance heating element 16 was wired in a one-stroke pattern in an annular region outside the circular region. The material of the electrostatic electrode 14 was tungsten carbide, the material of the resistance heating elements 16 was ruthenium metal, and the material of the jumper wire 18 was ruthenium metal. The material of the filler component used for the vias 20 and 22 was alumina, zirconia, or alumina and zirconia. In the experimental examples 1 to 10, the electrostatic chuck heater 10 was produced under the same conditions except that the materials listed in Table 1 were used as the materials for the heating element coupling via 20 and the power supply via 22. The thermal expansion coefficient (CTE) of each via in the experimental examples 1 to 10 in the temperature range of 40° C. to 800° C. is listed in Table 1.

In the experimental examples 1 to 10, after cross-sectional polishing, the alumina substrate 12 was checked for cracks in scanning electron microscope (SEM) observation. If there were no cracks, the electrostatic chuck heater 10 was placed in a vacuum chamber. When a predetermined reference point reached 60° C., the temperature distribution of the wafer placement surface 12a was measured with an infrared thermometer (IR camera) from outside the chamber, and the difference between the temperature of the wafer placement surface 12a just above the vias 20 and 22 and the temperature of the reference point was determined (heat generation [° C.] in Table 1). Table 1 shows the results.

TABLE 1

| Experimental example | Material of via | | | CTE of Via [ppm/K] | Difference in CTE between via and substrate [ppm/K] | Crack | Heat generation [° C.] |
| --- | --- | --- | --- | --- | --- | --- | --- |
| | Ruthenium metal [wt %] | Alumina filler [wt %] | Zirconia filler [wt %] | | | | |
| 1 | 10 | 90 | — | 7.8 | 0.1 | Not occurred | 2.0 |
| 2 | 20 | 80 | — | 7.8 | 0.1 | Not occurred | 1.8 |
| 3 | 40 | 60 | — | 7.6 | 0.3 | Not occurred | 1.4 |
| 4 | 60 | 40 | — | 7.5 | 0.4 | Not occurred | 1.0 |
| 5 | 80 | 10 | 10 | 7.6 | 0.3 | Not occurred | 0.6 |
| 6 | 80 | 20 | — | 7.3 | 0.6 | Not occurred | 0.6 |
| 7 | 95 | — | 5 | 7.4 | 0.5 | Not occurred | 0.3 |
| 8 | 10 | — | 90 | 10.2 | −2.3 | Occurred | — |
| 9 | 95 | 5 | — | 7.2 | 0.7 | Occurred | — |
| 10 | 100 | 0 | — | 7.2 | 0.7 | Occurred | — |

Table 1 shows that in the experimental examples 1 to 7 heat generation just above the vias 20 and 22 could be suppressed to 2.0 [° C.] or less, and cracking did not occur. In particular, in the experimental examples 2 to 7, heat generation just above the vias 20 and 22 could be suppressed to 1.8 [° C.] or less, and in the experimental examples 4 to 7 heat generation just above the vias 20 and 22 could be suppressed to 1.0 [° C.] or less. In contrast, in the experimental example 8, the addition of excess zirconia increased the CTE difference between the vias 20 and 22 and the alumina substrate 12 and caused cracking. In the experimental examples 9 and 10, the addition of a too small amount of alumina increased the CTE difference between the vias 20 and 22 and the alumina substrate and caused cracking. In the experimental example 10, the addition of no filler component increased the CTE difference between the vias 20 and 22 and the alumina substrate and caused cracking. The experimental examples 1 to 7 correspond to examples of the present invention, and the experimental examples 8 to 10 correspond to comparative examples. The present invention is not limited to these examples.

The present application claims priority from Japanese Patent Application No. 2019-169348 filed Sep. 18, 2019, the entire contents of which are incorporated herein by reference.

What is claimed is:

1. An electrostatic chuck heater comprising: an alumina substrate having a wafer placement surface on its upper surface; an electrostatic electrode, a resistance heating element provided for each zone, and a multilayer jumper wire for supplying power to the resistance heating element, which are buried in the alumina substrate in this order on the wafer placement surface side; a heating element coupling via for vertically coupling the resistance heating element to the jumper wire; and a power supply via extending outward for supplying power to the jumper wire, wherein each of the heating element coupling via and the power supply via contains 10% to 95% by weight ruthenium metal and has a difference in thermal expansion coefficient within ±0.6 ppm/K from the alumina substrate.

2. The electrostatic chuck heater according to claim 1, wherein the ruthenium metal content of each of the heating element coupling via and the power supply via ranges from 20% to 95% by weight.

3. The electrostatic chuck heater according to claim 1, wherein the heating element coupling via and the power supply via contain a filler component in addition to the ruthenium metal.

4. The electrostatic chuck heater according to claim 3, wherein the filler component is alumina and/or zirconia.

5. The electrostatic chuck heater according to claim 1, wherein each of the electrostatic electrode, the resistance heating element, and the jumper wire contains 10% to 95% by weight ruthenium metal and has a difference in thermal expansion coefficient within ±0.6 ppm/K from the alumina substrate.

6. The electrostatic chuck heater according to claim 5, wherein the ruthenium metal content of each of the electrostatic electrode, the resistance heating element, and the jumper wire ranges from 20% to 95% by weight.

7. The electrostatic chuck heater according to claim 5, wherein the electrostatic electrode, the resistance heating element, and the jumper wire contain a filler component in addition to the ruthenium metal.

8. The electrostatic chuck heater according to claim 7, wherein the filler component is alumina and/or zirconia.

* * * * *